US006555958B1

(12) United States Patent
Srivastava et al.

(10) Patent No.: US 6,555,958 B1
(45) Date of Patent: *Apr. 29, 2003

(54) PHOSPHOR FOR DOWN CONVERTING ULTRAVIOLET LIGHT OF LEDS TO BLUE-GREEN LIGHT

(75) Inventors: Alok Mani Srivastava, Niskayuna, NY (US); Thomas Francis McNulty, Ballston Lake, NY (US); Holly Ann Comanzo, Niskayuna, NY (US); Dan Darcy Doxsee, Sagamore Hills, OH (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/571,382

(22) Filed: May 15, 2000

(51) Int. Cl.$^7$ ............... H05B 33/00; H05B 33/10; H05B 33/14
(52) U.S. Cl. ............... 313/506; 502/503; 502/509; 340/815.4; 340/907; 340/815.45; 257/89; 257/98; 257/102; 252/301.4 F; 252/301.6 F
(58) Field of Search ............... 252/301.4 F, 301.6 F, 252/301.4 R; 340/815.4, 815.45; 313/485, 486, 502; 257/89, 98, 102

(56) References Cited

U.S. PATENT DOCUMENTS

| | | | | |
|---|---|---|---|---|
| 3,651,363 A | * | 3/1972 | Barry | 313/486 |
| 3,676,361 A | * | 7/1972 | Datta | 252/301.4 F |
| 4,661,419 A | | 4/1987 | Nakamura | 428/691 |
| 5,198,679 A | | 3/1993 | Katoh et al. | 250/484.1 |
| 5,424,006 A | * | 6/1995 | Murayama et al. | 252/301.4 R |
| 5,571,451 A | | 11/1996 | Srivastava et al. | 252/301.4 |
| 5,813,753 A | | 9/1998 | Vriens et al. | 362/293 |
| 5,847,507 A | | 12/1998 | Butterworth et al. | 313/512 |
| 5,851,063 A | | 12/1998 | Doughty et al. | 362/231 |
| 5,925,897 A | | 7/1999 | Oberman | 257/80 |
| 5,966,393 A | | 10/1999 | Hide et al. | 372/23 |
| 5,998,925 A | | 12/1999 | Shimizu et al. | 313/503 |
| 6,066,861 A | | 5/2000 | Höhn et al. | 257/99 |
| 6,069,440 A | | 5/2000 | Shimizu et al. | 313/486 |
| 6,084,250 A | | 7/2000 | Jüstel et al. | |
| 6,096,243 A | * | 8/2000 | Oshio et al. | 252/301.4 R |
| 6,234,648 B1 | * | 5/2001 | Borner et al. | 313/512 |
| 6,278,135 B1 | * | 8/2001 | Srivastava et al. | 257/98 |
| 6,429,583 B1 | * | 8/2002 | Levinson et al. | 313/503 |
| 6,466,135 B1 | * | 10/2002 | Srivastava et al. | 340/815.4 |

FOREIGN PATENT DOCUMENTS

JP          183408       6/2000

OTHER PUBLICATIONS

Keith Butler: Fluorescent Lamp Phosphors, pp. 98–107 (The Pennsylvania State University Press 1980).

(List continued on next page.)

*Primary Examiner*—Nimeshkumar D. Patel
*Assistant Examiner*—Mariceli Santiago
(74) *Attorney, Agent, or Firm*—Foley & Lardner

(57) ABSTRACT

There is provided a blue-green illumination system, comprising a light emitting diode, and a luminescent material having emission CIE color coordinates located within an area of a of a pentagon on a CIE chromaticity diagram, whose corners have the following CIE color coordinates:

i) x=0.0137 and y=0.4831;
ii) x=0.2240 and y=0.3890;
iii) x=0.2800 and y=0.4500;
iv) x=0.2879 and y=0.5196; and
v) x=0.0108 and y=0.7220.

The light emitting diode may be a UV LED and the luminescent material may be a $Ba_2SiO_4:Eu^{2+}$ phosphor, a $Ba_2(Mg,Zn)Si_2O_7:Eu^{2+}$ phosphor and/or a $Ba_2Al_2O_4:Eu^{2+}$ phosphor. The illumination system may be used as the green light of a traffic light or an automotive display.

39 Claims, 6 Drawing Sheets

OTHER PUBLICATIONS

S. Nakamura et al.: The Blue Laser Diode, pp. 216–221, 328–329 (Springer 1997).

G. Blasse et al.: Luminescent Materials, pp. 109–110 (Springer–Verlag 1994).

Blasse et al.: "Fluorescence of $Eu^{2+}$–Activated Alkaline–Earth Aluminates," Philips Res. Repts, 23, 201–206 (1968).

Blasse et al: "Fluorescence of $Eu^{2+}$–Activated Silicates," Philips Res. Repts, 23, 189–200 (1968).

S. Shionoya et al: "Phosphor Handbook," 168–170, 317–330, 343–349, 389–410, 412–417, 419–431, 555, 623–636 (1999).

* cited by examiner

PHOSPHOR FOR DOWN CONVERTING ULTRAVIOLET LIGHT OF LEDS TO BLUE-GREEN LIGHT

STATEMENT REGARDING FEDERALLY SPONSORED RESEARCH OR DEVELOPMENT

The U.S. Government may have certain rights in this invention pursuant to grant No. 70NANB8H4022 from the NIST.

BACKGROUND OF THE INVENTION

This invention relates generally to a blue-green light illumination system, and specifically to a ceramic phosphor for converting UV radiation emitted by a light emitting diode ("LED") to blue-green light.

Semiconductor light emitting diodes are semiconductor chips that are mounted in a package and which emit radiation in response to an applied voltage or current. These LEDs are used in a number of commercial applications such as automotive, display, safety/emergency and directed area lighting.

One important application of semiconductor LEDs is as a light source in a traffic light. Presently, a plurality of blue-green emitting LEDs containing III-V semiconductor layers, such as GaN, etc., are used as the green light of a traffic signal (also known as a traffic light).

Industry regulations often require traffic light colors to have very specific CIE color coordinates. For example, according to the Institute of Transportation Engineers (ITE), a green traffic light in the United States is typically required to have emission CIE color coordinates located within an area of a quadrilateral on a CIE chromaticity diagram, whose corners have the following color coordinates:

a) x=0.000 and y=0.506;
b) x=0.224 and y=0.389;
c) x=0.280 and y=0.450; and
d) x=0.000 and y=0.730.

The following CIE color coordinates are most preferred for green traffic light applications: x=0.1 and y=0.55.

Likewise, industry regulations require automotive display colors to have specific CIE color coordinates. According to the Society of Automotive Engineers (SAE), a green automotive display, such as a vehicle dashboard display, is typically required to have emission CIE color coordinates located within an area of a quadrilateral on a CIE chromaticity diagram, whose corners have the following color coordinates:

e) x=0.0137 and y=0.4831;
f) x=0.2094 and y=0.3953;
g) x=0.2879 and y=0.5196; and
h) x=0.0108 and y=0.7220.

The color coordinates (also known as the chromaticity coordinates) and the CIE chromaticity diagram are explained in detail in several text books, such as on pages 98–107 of K. H. Butler, "Fluorescent Lamp Phosphors" (The Pennsylvania State University Press 1980) and on pages 109–110 of G. Blasse et al., "Luminescent Materials" (Springer-Verlag 1994), both incorporated herein by reference.

Presently, GaN based LEDs are designed to emit blue-green light with a peak wavelength of 505 nm, which has the desired CIE color coordinates of x=0.1 and y=0.55. Table I illustrates the optical properties of an LED having an $In_{1-x}Ga_xN$ active layer that was manufactured according to desired parameters.

TABLE I

| Color Coordinates | | Peak Emission Wavelength | Emission Peak Half Width | External Quantum Efficiency | Efficacy (lm/W) |
|---|---|---|---|---|---|
| x | y | | | | |
| 0.1 | 0.55 | 505 nm | 35 nm | 10% | 25 lm/W |

In Table I, external quantum efficiency refers to a ratio of a number of photons emitted per number of electrons injected into the LED.

However, these LEDs with the $In_{1-x}Ga_xN$ active layer suffer from the following disadvantage. Due to frequent deviations from desired parameters (i.e., manufacturing systematic variations), the LED peak emission wavelength deviates from 505 nm, and thus, its CIE color coordinates deviate from the desired x=0.1 and y=0.55 values. For example, the LED color output (e.g., spectral power distribution and peak emission wavelength) varies with the band gap width of the LED active layer. One source of deviation from the desired color coordinates is the variation in the In to Ga ratio during the deposition of the $In_{1-x}Ga_xN$ active layer, which results in an active layer whose band gap width deviates from the desired value. This ratio is difficult to control precisely during mass production of the LEDs, which leads to inconsistent color coordinates in a given batch of LEDs. Thus, the $In_{1-x}Ga_xN$ LEDs which are suitable for use in traffic lights have a lower production yield because a large number of such LEDs with unsuitable emission color coordinates have to be discarded. The present invention is directed to overcoming or at least reducing the problem set forth above.

BRIEF SUMMARY OF THE INVENTION

In accordance with one aspect of the present invention, there is provided a blue-green illumination system, comprising a light emitting diode and a luminescent material having emission CIE color coordinates located within an area of a pentagon on a CIE chromaticity diagram, whose corners have the following CIE color coordinates:

e) x=0.0137 and y=0.4831;
b) x=0.2240 and y=0.3890;
c) x=0.2800 and y=0.4500;
g) x=0.2879 and y=0.5196; and
h) x=0.0108 and y=0.7220.

In accordance with another aspect of the present invention, there is provided a traffic light, comprising a housing, at least one lens, a radiation source having a peak emission wavelength of 420 nm and below, and a luminescent material having emission CIE color coordinates located within an area of a quadrilateral on a CIE chromaticity diagram, whose corners have the following CIE color coordinates:

a) x=0.000 and y=0.506;
b) x=0.224 and y=0.389;
c) x=0.280 and y=0.450; and
d) x=0.000 and y=0.730.

In accordance with another aspect of the present invention, there is provided a method of making a blue-green light illumination system, comprising mixing a plurality of starting powders to form a starting powder mixture, firing the starting powder mixture to form a calcined body, converting the calcined body into a phosphor powder having emission CIE color coordinates located within an area of a pentagon on a CIE chromaticity diagram, whose corners have the following color coordinates:

e) x=0.0137 and y=0.4831;
b) x=0.2240 and y=0.3890;
c) x=0.2800 and y=0.4500;
g) x=0.2879 and y=0.5196; and
h) x=0.0108 and y=0.7220.

and placing the phosphor powder into the illumination system adjacent a light emitting diode.

DETAILED DESCRIPTION OF THE INVENTION

In view of the problems in the prior art, it is desirable to obtain a blue-green light illumination system whose color output is less sensitive to variations during system operation and manufacturing process, especially due to variations in the color output of the light source. The present inventors have discovered that a color output of a blue-green light illumination system is less sensitive to these variations if the color output of the system does not include significantly visible radiation emitted by the light source, such as an LED. In this case, the color output of the system does not vary significantly with color output of the LED.

The present inventors have discovered that a blue-green light illumination system that contains a luminescent material in addition to an LED is less sensitive to the undesirable variations if the blue-green light output by the system is light output by the luminescent material. In this case, the color output of the system depends only on the color output of the luminescent material. The term luminescent material preferably includes a luminescent material in loose or packed powder form (phosphor), but may also include a luminescent material in solid crystalline body form (scintillator).

The color output of a luminescent material varies much less with the composition of the luminescent material than the color output of an LED varies with the composition of the LED. Furthermore, luminescent material manufacture is less prone to material composition errors than semiconductor LED manufacturing. Therefore, out of a certain number of systems made, a higher percentage of the blue-green light illumination systems that contain a luminescent material in addition to an LED would have the desired CIE color coordinates for traffic light and other applications than a system that only contains a blue-green LED. Thus, an LED—luminescent material blue-green light illumination system has a higher manufacturing yield for traffic light or other applications than a system that only contains a blue-green LED.

The color output of the system does not vary significantly with the color output of the LED if the blue-green light emitted by the system lacks any significant visible component emitted by the LED. Therefore, the composition of the LED does not affect the color output of the system. This can be achieved in at least two ways.

One way to avoid affecting the color output of the system is by using a radiation source that emits radiation at a wavelength that is not significantly visible to the human eye. For example, an LED may be constructed to emit ultraviolet (UV) radiation having a wavelength of 380 nm or less that is not visible to the human eye. Furthermore, the human eye is not very sensitive to UV radiation having a wavelength between 380 and 400 nm and to violet light having a wavelength between 400 and 420 nm. Therefore, the radiation emitted by the LED having a wavelength of 420 nm or less would not substantially affect the color output of the LED—phosphor system irrespective of whether the emitted LED radiation is transmitted through the phosphor or not, because radiation having a wavelength of about 420 nm or less is not significantly visible to a human eye.

The second way to avoid affecting the color output of the system is by using a thick luminescent material which does not allow the radiation from the radiation source to pass through it. For example, if the LED emits visible light between 420 and 650 nm, then in order to ensure that the phosphor thickness does not affect the color output of the system, the phosphor should be thick enough to prevent any significant amount of the visible light emitted by the LED from penetrating through the phosphor. Alternatively, if the LED emission wavelength is from 420 to 490 nm or from 530 to 650 nm, then a filter may be used instead of the thick phosphor. The filter should filter transmission of the LED radiation but permit the radiation emitted by the phosphor to pass through. Preferably, the phosphor emits radiation at about 505 nm. However, while this way to avoid affecting the color output of the system is possible, it is not preferred because it lowers the output efficiency of the system.

In both cases described above, the color of the visible light emitted by the system is solely or almost entirely dependent on the type of luminescent material used. Therefore, in order for the LED—phosphor system to emit blue-green light, the phosphor should emit blue-green light when it is irradiated by the LED radiation.

Figure 1:
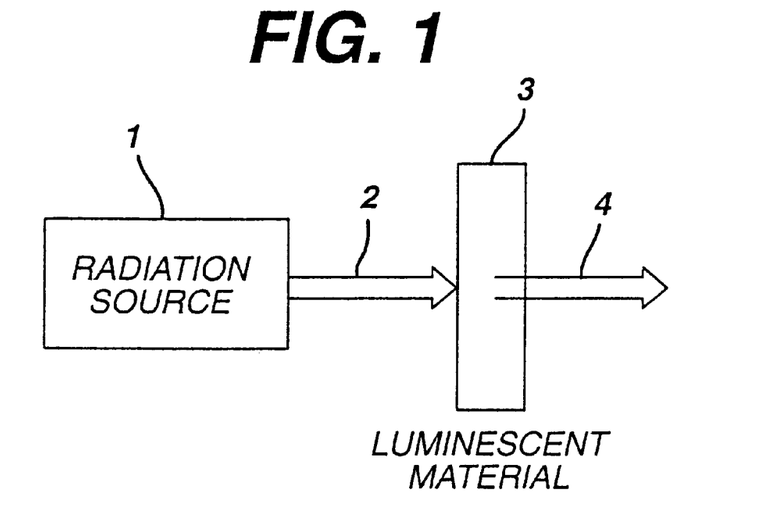
FIG. 1 is schematic illustration of a blue-green light illumination system according to one embodiment of the present invention.

FIG. 1 schematically illustrates the above principle. In FIG. 1, a radiation source 1, such as an LED, emits radiation 2 incident on the luminescent material, such as a phosphor 3. The radiation 2 may have a wavelength to which the human eye is substantially not sensitive, such as 420 nm and below. Alternatively, the phosphor 3 may be too thick to allow the radiation 2 to penetrate to the other side. After absorbing the incident radiation 2, the phosphor 3 emits blue-green light 4.

In one preferred aspect of the present invention, the blue-green light 4 has emission CIE color coordinates located within an area of a quadrilateral on a CIE chromaticity diagram, whose corners have the following color coordinates:

a) x=0.000 and y=0.506;

b) x=0.224 and y=0.389;

c) x=0.280 and y=0.450; and d) x=0.000 and y=0.730.

Figure 2:
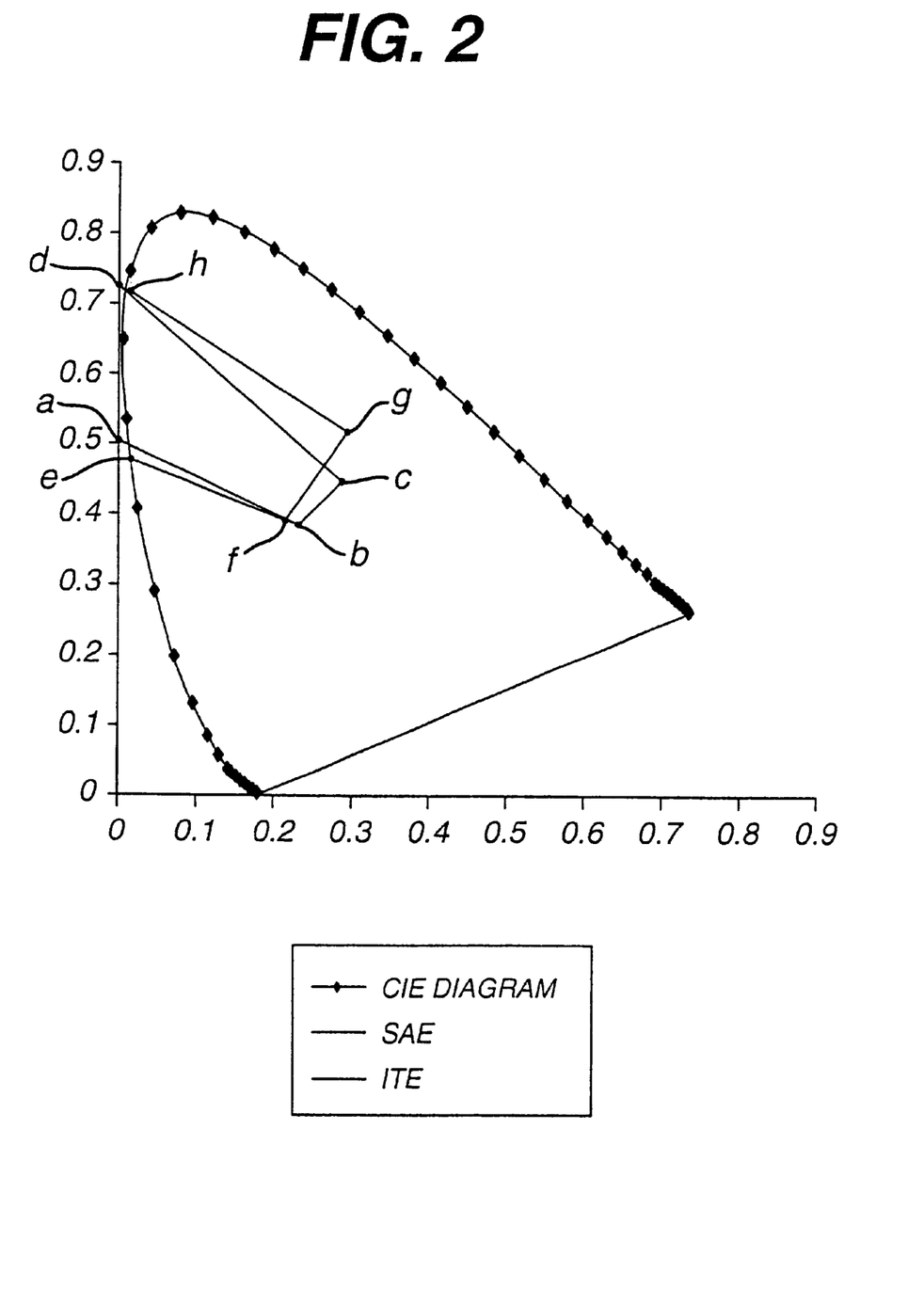
FIG. 2 is a CIE chromaticity diagram including the quadrilaterals containing the color coordinates allowed for green traffic light and green automotive display applications.

These color coordinates are particularly advantageous for green traffic light applications because they are within the ITE green traffic light bin delineated by the quadrilateral a-b-c-d illustrated in FIG. 2.

In another preferred aspect of the present invention, the blue-green light 4 has emission CIE color coordinates located within an area of a quadrilateral on a CIE chromaticity diagram, whose corners have the following color coordinates:

e) x=0.0137 and y=0.4831;

f) x=0.2094 and y=0.3953;

g) x=0.2879 and y=0.5196; and h) x=0.0108 and y=0.7220.

These color coordinates are particularly advantageous for green automotive display applications because they are within the SAE green automotive display bin delineated by the quadrilateral e-f-g-h illustrated in FIG. 2. The color coordinates may be used in displays other than automotive displays, if desired.

In another preferred aspect of the present invention, the blue-green light 4 has emission CIE color coordinates located within an area of a pentagon on a CIE chromaticity diagram, whose corners have the following color coordinates:

e) x=0.0137 and y=0.4831;

b) x=0.2240 and y=0.3890;

c) x=0.2800 and y=0.4500;

g) x=0.2879 and y=0.5196; and h) x=0.0108 and y=0.7220.

Figure 3:
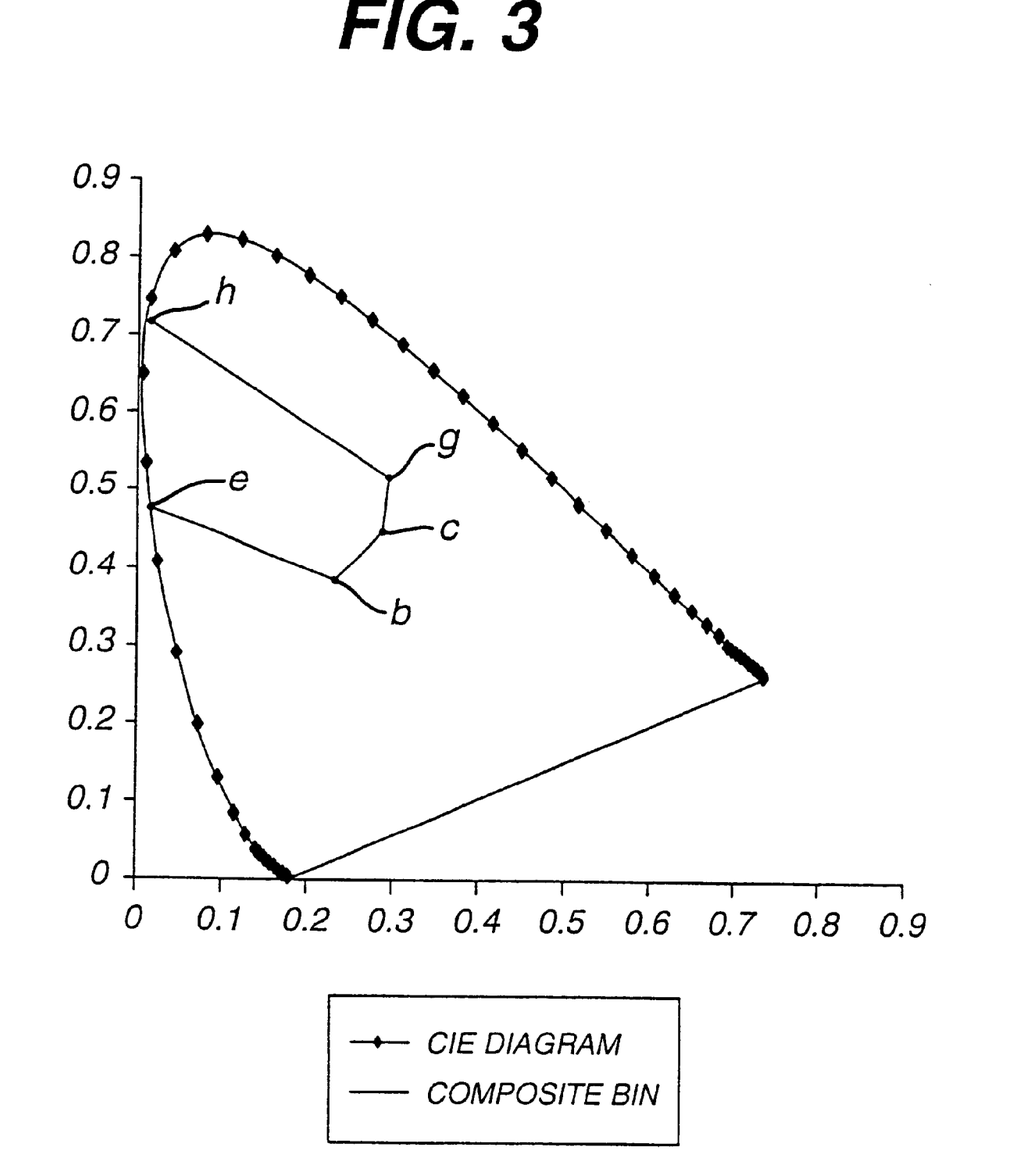
FIG. 3 is a CIE chromaticity diagram including the pentagon containing combined bin allowed for green traffic light and green automotive display applications.

The pentagon e-b-c-g-h is illustrated in FIG. 3. These color coordinates are advantageous for both green traffic light and automotive display applications because the area of the pentagon e-b-c-g-h includes the areas of both quadrilaterals a-b-c-d and e-f-g-h illustrated in FIG. 2. As shown in FIGS. 2 and 3, side e-h of the pentagon and the quadrilateral may be slightly bowed to follow the contour of the chromaticity curve. Preferably, the light 4 emitted by the phosphor has the CIE color coordinates of x=0.1±0.05 and y=0.52±0.05.

The present inventors have discovered that several phosphors have emission CIE color coordinates that are suitable for green traffic light and green automotive display applications. In other words, these phosphors have emission CIE color coordinates of x=0.1±0.05 and y=0.52±0.05 and/or are located inside the area of pentagon e-b-c-g-h in FIG. 3.

One such phosphor is a divalent europium activated alkaline earth silicate phosphor, ASiO:$Eu^{2+}$, where A comprises at least one of Ba, Ca, Sr or Mg. Preferably, the ASiO:$Eu^{2+}$ phosphor has the following composition: $A_2SiO_4$:$Eu^{2+}$, where A comprises at least 50% Ba, preferably at least 80% Ba. If A comprises Ba or Ca, then the phosphor peak emission wavelength is about 505 nm and the phosphor quantum efficiency is high for Ba and low for Ca. If A comprises Sr, then the phosphor peak emission wavelength is about 580 nm and the phosphor quantum efficiency is medium. Therefore, A most preferably comprises Ba to obtain a peak wavelength closest to 505 nm and to obtain the highest relative quantum efficiency.

In the alkaline earth silicate phosphor, the europium activator substitutes on the alkaline earth lattice site, such that the phosphor may be written as: $(A_{1-x}Eu_x)_2SiO_4$, where $0<x\leq0.2$. Therefore, the most preferred phosphor composition is $(Ba_{1-x}Eu_x)_2SiO_4$, where $0<x\leq0.2$. The alkaline earth silicate phosphor may also contain other impurities and dopants. For example, the phosphor may contain a small amount of fluorine incorporated during powder processing from a fluorine containing flux compound, such as $BaF_2$ or $EuF_3$.

Other phosphors also have emission CIE color coordinates that are located within the area of the pentagon e-b-c-g-h in FIG. 3. For example, another divalent europium activated alkaline earth silicate phosphor, ADSiO:$Eu^{2+}$ where A comprises at least one of Ba, Ca or Sr and D comprises at least one of Mg and Zn, has emission CIE color coordinates that are located inside the quadrilateral. Preferably, the ADSiO:$Eu^{2+}$ phosphor has the following composition: $A_2DSi_2O_7$:$Eu^{2+}$. The peak emission wavelength and the relative quantum efficiency of each isomorphous phosphor is illustrated in Table II below:

TABLE II

| A | D | A | D | A | D | A | D | A | D | A | D |
|---|---|---|---|---|---|---|---|---|---|---|---|
| Ca | Mg | Sr | Mg | Sr | Zn | Sr/Ba | Mg | Ba | Mg | Ba | Zn |
| Peak λ | 535 | | 470 | | 470 | | 440 | | 500 | | 505 | |
| QE | Low | | Medium | | Medium | | Medium | | High | | High | |

Therefore, A most preferably comprises Ba in order to obtain the peak wavelength closest to 505 nm and to obtain the highest relative quantum efficiency.

In the alkaline earth silicate phosphor, the europium activator substitutes on the alkaline earth lattice site, such that the phosphor may be written as: $(A_{1-x}Eu_x)_2DSi_2O_7$, where $0<x\leq0.2$. Therefore, the most preferred phosphor compositions are $(Ba_{1-x}Eu_x)_2MgSi_2O_7$, and $(Ba_{1-x}Eu_x)_2ZnSi_2O_7$ where $0<x\leq0.2$. The alkaline earth silicate phosphor may also contain other impurities and dopants. For example, the phosphor may contain a small amount of fluorine incorporated during powder processing from a fluorine containing flux compound, such as $BaF_2$ or $EuF_3$.

A third phosphor that has emission CIE color coordinates that are located within the area of pentagon e-b-c-g-h in FIG. 3 is a divalent europium activated alkaline earth aluminate phosphor, AAlO:$Eu^{2+}$, where A comprises at least one of Ba, Sr or Ca. Preferably, the AAlO:$Eu^{2+}$ phosphor has the following composition: $AAl_2O_4$:$Eu^{2+}$, where A comprises at least 50% Ba, preferably at least 80% Ba and 20% or less Sr. If A comprises Ba, then the phosphor peak emission wavelength is about 505 nm and the phosphor quantum efficiency is high. If A comprises Sr, then the phosphor peak emission wavelength is about 520 nm and the phosphor quantum efficiency is fairly high. If A comprises Ca, then the phosphor peak emission wavelength is about 440 nm and the phosphor quantum efficiency is low. Therefore, A most preferably comprises Ba to obtain a peak wavelength closest to 505 nm and to obtain the highest relative quantum efficiency. Alternatively, a small amount of Ba may be substituted with Sr to shift the peak wavelength to a slightly higher wavelength, if desired.

In the alkaline earth aluminate phosphor, the europium activator substitutes on the alkaline earth lattice site, such that the phosphor may be written as: $(A_{1-x}Eu_x)Al_2O_4$, where $0<x\leq0.2$. Therefore, the most preferred phosphor composition is $(Ba_{1-x}Eu_x)Al_2O_4$ where $0<x\leq0.2$. The alkaline earth aluminate phosphor may also contain other impurities and dopants, such as fluorine incorporated from a flux.

The europium activated alkaline earth silicate phosphors are described in detail in G. Blasse et al., "*Fluorescence of $Eu^{2+}$ Activated Silicates*" 23 Philips Res. Repts. 189–200

(1968), incorporated herein by reference. The europium activated alkaline earth aluminates phosphors are described in detail in G. Blasse et al., "Fluorescence of $Eu^{2+}$ Activated Alkaline-Earth Aluminates" 23 Philips Res. Repts. 201–206 (1968), incorporated herein by reference. These references also illustrate the emission and excitation spectra of the above described phosphors.

In one aspect of the present invention, the silicate and aluminate phosphors may be used together in a phosphor mixture or blend in order to optimize the color or other emission properties, if desired. For example, the phosphors may be used in the following combinations: $ASiO:Eu^{2+}$ and $ADSiO:Eu^{2+}$, $ASiO:Eu^{2+}$ and $AAlO:Eu^{2+}$, $ADSiO:Eu^{2+}$ and $AAlO:Eu^{2+}$, $ASiO:Eu^{2+}$ and $ADSiO:Eu^{2+}$ and $AAlO:Eu^{2+}$. Alternatively the above mentioned phosphors may be placed into the same illumination system as overlying layers rather than as a blend. Other phosphors and scintiallators that have the desired emission CIE color coordinates may be used instead of or in addition to the three phosphors described above.

The radiation source 1 may comprise any radiation source capable of causing a blue-green emission 4 from the phosphor 3, as illustrated in FIG. 1. Preferably, the radiation source 1 comprises an LED. However, the radiation source 1 may also comprise a gas, such as mercury in a fluorescent lamp. Thus, the blue-green light illumination system may comprise a fluorescent lamp containing the blue-green emitting phosphor. These illumination systems may be used as a green light of a traffic light.

According to the first preferred embodiment of the present invention, the phosphor 3 is placed into a blue-green light illumination system containing an LED. The LED may be any LED which causes the phosphor 3 to emit blue-green radiation 4, when the radiation 2 emitted by the LED is directed onto the phosphor. Thus, the LED may comprise a semiconductor diode based on any suitable III–V, II–VI or IV—IV semiconductor layers and having an emission wavelength of 420 nm and below. For example, the LED may contain at least one semiconductor layer based on GaN, ZnSe or SiC semiconductors. The LED may also contain one or more quantum wells in the active region, if desired. Preferably, the LED active region may comprise a p-n junction comprising GaN, AlGaN and/or InGaN semiconductor layers. The p-n junction may be separated by a thin undoped InGaN layer or by one or more InGaN quantum wells. The LED may have an emission wavelength between 360 and 420 nm, preferably between 370 and 405 nm. For example the LED may have the following wavelengths: 370, 375, 380, 390 or 405 nm.

Figure 4:
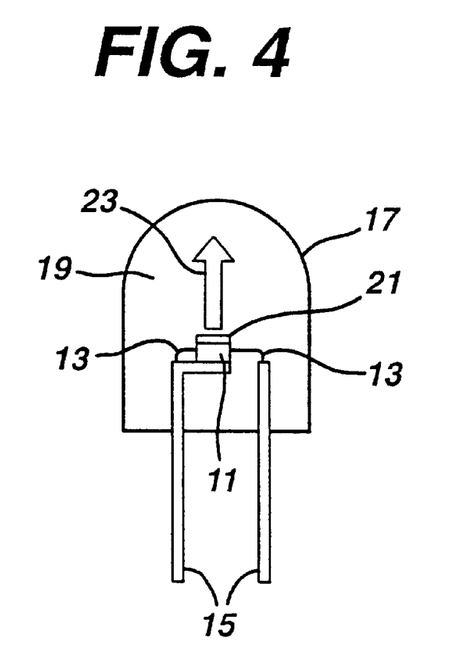
FIGS. 4–6 are cross-sectional schematic views of illumination systems using an LED according to the first preferred embodiment of the present invention.

The blue-green light illumination system according to the preferred embodiment of the present invention may have various different structures. The first preferred structure is schematically illustrated in FIG. 4. The illumination system includes a light emitting diode chip 11 and leads 13 electrically attached to the LED chip. The leads 13 may comprise thin wires supported by a thicker lead frame(s) 15 or the leads may comprise self supported electrodes and the lead frame may be omitted. The leads 13 provide current to the LED chip 11 and thus cause the LED chip 11 to emit radiation.

The LED chip 11 is encapsulated within a shell 17 which encloses the LED chip and an encapsulant material 19. The encapsulant material preferably comprises a UV resistant epoxy. The shell 17 may be, for example, glass or plastic. The encapsulant material may be, for example, an epoxy or a polymer material, such as silicone. However, a separate shell 17 may be omitted and the outer surface of the encapsulant material 19 may comprise the shell 17. The LED chip 11 may be supported, for example, by the lead frame 15, by the self supporting electrodes, the bottom of the shell 17 or by a pedestal (not shown) mounted to the shell or to the lead frame.

The first preferred structure of the illumination system includes a phosphor layer 21 comprising the phosphor 3. The phosphor layer 21 may be formed over or directly on the light emitting surface of the LED chip 11 by coating and drying a suspension containing the phosphor powder over the LED chip 11. After drying, the phosphor powder forms a solid phosphor layer or coating 21. Both the shell 17 and the encapsulant 19 should be transparent to allow blue-green light 23 to be transmitted through those elements.

Figure 5:
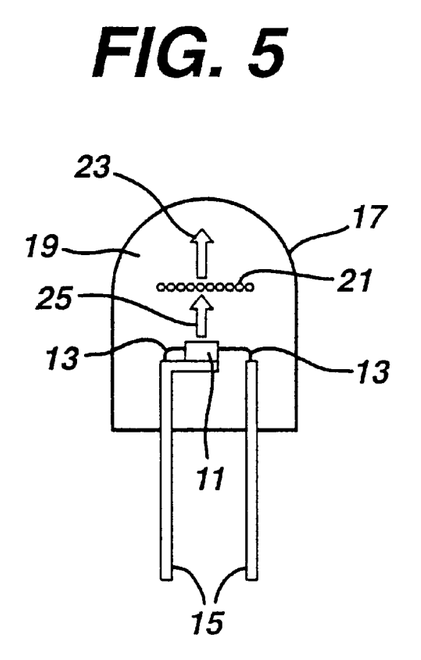

FIG. 5 illustrates a second preferred structure of the system according to the first preferred embodiment of the present invention. The structure of FIG. 5 is the same as that of FIG. 4, except that the phosphor 3 powder is interspersed within the encapsulant material 19, instead of being formed over the LED chip 11. The phosphor 3 powder may be interspersed within a single region 21 of the encapsulant material 19 or throughout the entire volume of the encapsulant material. The phosphor powder is interspersed within the encapsulant material, for example, by adding the powder to a polymer precursor, and then curing the polymer precursor to solidify the polymer material. Alternatively, the phosphor powder may be mixed in with the epoxy encapsulant. Other phosphor interspersion methods may also be used. Alternatively, a solid phosphor layer 21 comprising the phosphor 3 may be inserted into the encapsulant material 19 if desired. In this structure, the phosphor absorbs the radiation 25 emitted by the LED and in response, emits blue-green light 23.

Figure 6:
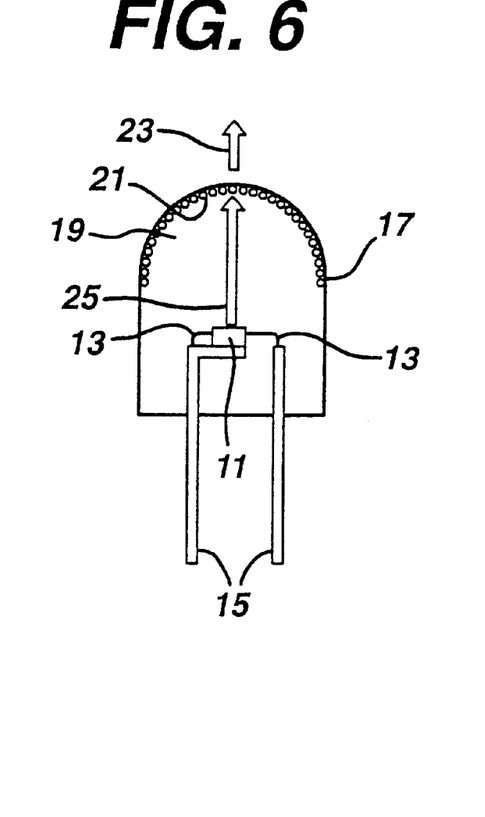

FIG. 6 illustrates a third preferred structure of the system according to the first preferred embodiment of the present invention. The structure of FIG. 6 is the same as that of FIG. 4, except that the phosphor layer 21 containing the phosphor 3 is formed on the shell 17, instead of being formed over the LED chip 11. The phosphor layer 21 is preferably formed on the inside surface of the shell 17, although the phosphor layer 21 may be formed on the outside surface of the shell, if desired. The phosphor layer 21 may be coated on the entire surface of the shell or only a top portion of the surface of the shell 17.

Of course, the embodiments of FIGS. 4–6 may be combined and the phosphor may be located in any two or all three locations or in any other suitable location, such as separately from the shell or integrated into the LED. The radiation source 1 of the illumination system has been described above as a semiconductor light emitting diode. However, the radiation source of the present invention is not limited to a semiconductor light emitting diode. For example, the radiation source may comprise a laser diode or an organic light emitting diode (OLED).

Figure 7:
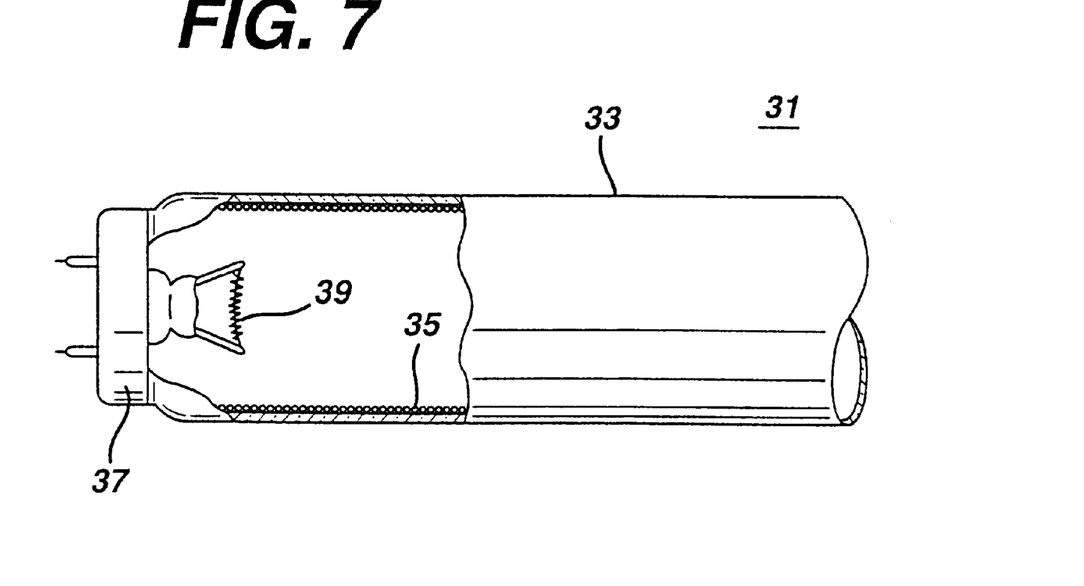
FIG. 7 is a cross-sectional schematic view of an illumination system using a fluorescent lamp according to the second preferred embodiment of the present invention.

According to the second preferred embodiment of the present invention, the phosphor 3 is placed into an illumination system containing a fluorescent lamp. A portion of a fluorescent lamp is schematically illustrated in FIG. 7. The lamp 31 contains a phosphor coating 35 comprising the phosphor 3 on a surface of the lamp cover 33, preferably the inner surface. The fluorescent lamp 31 also preferably contains a lamp base 37 and a cathode 39. The lamp cover 33 encloses a gas, such as mercury, which emits UV radiation in response to a voltage applied to the cathode 39.

Figure 8:
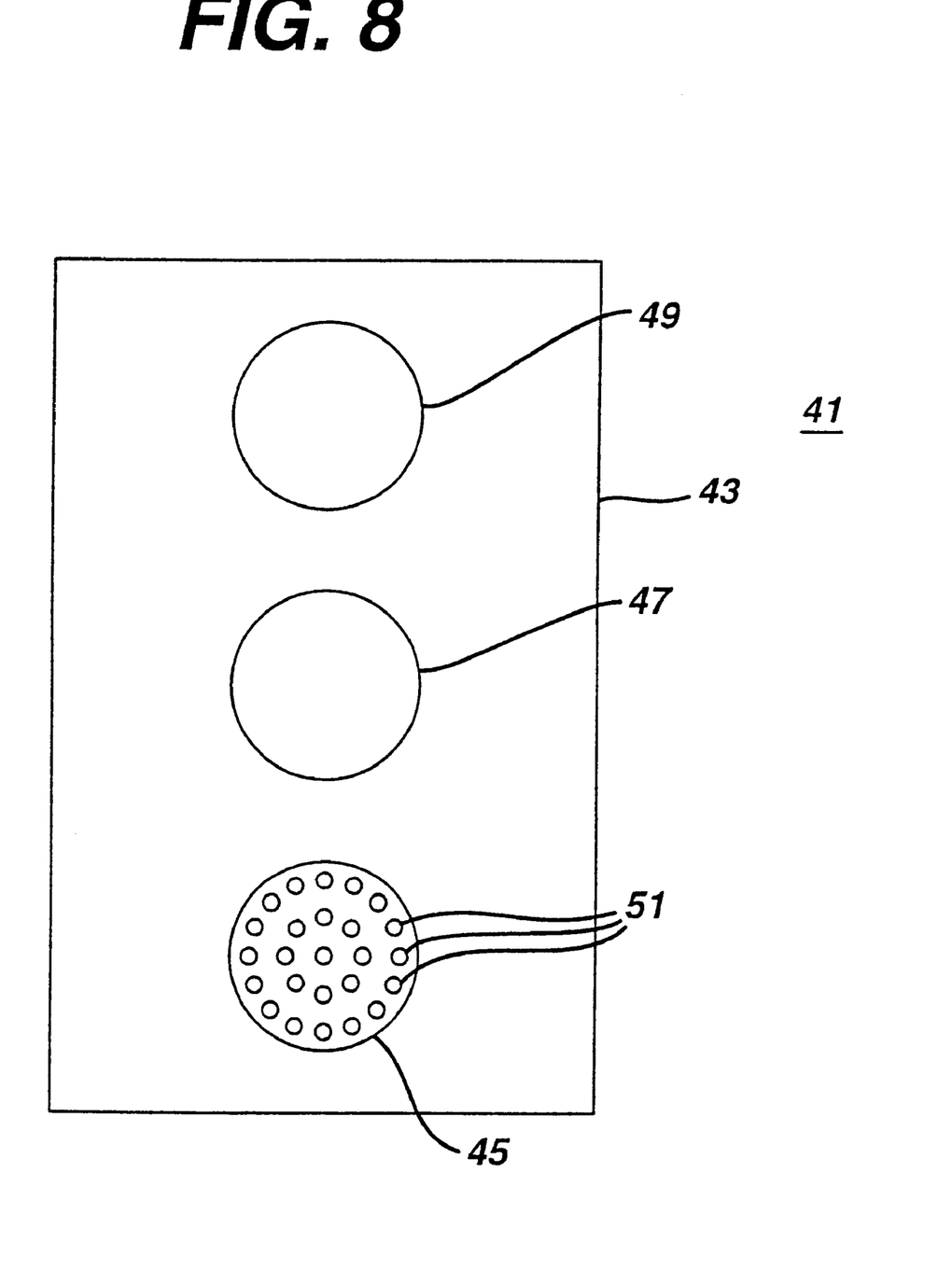
FIG. 8 is a schematic front view of a traffic signal containing the illumination systems of the preferred embodiments of the present invention as the green light.

According to the third preferred embodiment of the present invention, the illumination system comprises a traffic signal including a green traffic light which contains a plurality of the LED-phosphor or lamp-phosphor systems of the first or the second preferred embodiments as the green light source of the traffic signal. The traffic signal 41 is illustrated in FIG. 8. The traffic signal contains a base or a housing 43, which contains the light sources and the electronics which switch the individual light sources of the traffic light on and off. A plurality of lenses are included in openings in the housing 43. Preferably, the traffic signal contains a green lens 45, a yellow lens 47 and a red lens 49. Each lens may comprise clear or colored plastic or glass. If the light source emits only one color light (i.e., green, yellow or red), then the lens may be clear. However, if the light source emits white light, then the lens should be appropriately colored.

A plurality of light sources 51 described above are arranged inside the housing 43 behind the green lens 45. Each light source 51 contains a radiation source, such as an LED 11 or fluorescent lamp 31 and a luminescent material, such as the phosphor 3. The light sources 51 may be arranged in any manner around the green lens 45 in order to provide a high blue-green light output through the lens 45. The green traffic light may contain several light sources to one hundred or more light sources, as desired. While less preferred, a single, large area light source 51 may be used instead.

According to the fourth preferred embodiment of the present invention, the illumination system comprises an automotive display which contains a plurality of the LED-phosphor systems. Preferably, the automotive display is a vehicle dashboard display, such as a clock, an odometer display or a speedometer display. The system may also be used in non-automotive displays if desired.

A method of manufacturing the blue-green illumination system will now be described. The phosphor 3 may be made, for example, by any ceramic powder method, such as a wet chemical method or a solid state method. Preferably, the method of making the preferred $Ba_2SiO_4$:$Eu^{2+}$ phosphor comprises the following steps.

First, the starting compounds of the phosphor are manually blended or mixed in a crucible or mechanically blended or mixed in another suitable container, such as a ball mill, to form a starting powder mixture. The starting compounds may comprise any oxide, hydroxide, oxalate, carbonate and/or nitrate starting phosphor compound. The preferred starting phosphor compounds comprise barium carbonate $BaCO_3$, europium oxide, $Eu_2O_3$, and silicic acid, $SiO_2$*$xH_2O$. Preferably, a flux, such as $BaF_2$ and/or $EuF_3$ is added to the starting materials in an amount of 0.5 to 3 mole percent per mole of the phosphor produced. Calcium, barium and magnesium starting compounds, such as their carbonate or oxide compounds, may also be added if it is desired to substitute some or all of the barium with calcium, strontium and/or magnesium.

The starting powder mixture is then fired a first time in a carbon containing atmosphere, such as in a coconut charcoal containing atmosphere at 1200 to 1400° C. for 5 to 7 hours to form a first calcined phosphor body or cake. The resultant cake is then ground and milled to a powder. This powder is then annealed or fired a second time in a reducing atmosphere at about 900 to 1200° C. to form a second calcined phosphor body or cake. Preferably the powder is annealed in a furnace in an atmosphere comprising nitrogen and 0.1 to 10% hydrogen for two to six hours, and subsequently cooled in the same atmosphere. The first firing step may be omitted if a second annealing step is carried out at a high temperature, such as 1200 to 1400° C., in a furnace suitable for supplying a reducing atmosphere at a high temperature.

Other annealing conditions may be used, depending on the available equipment.

The solid calcined phosphor body may be converted to a phosphor powder in order to easily coat the phosphor powder on a portion of the blue-green light illumination system. The solid phosphor body may be converted to the phosphor powder by any crushing, milling or pulverizing method, such as wet milling, dry milling, jet milling or crushing. Preferably, the solid body is wet milled in propanol, ethanol, methanol and/or water, and subsequently dried.

The $A_2DSi_2O_7$:$Eu^{2+}$ and $AAl_2O_4$:$Eu^{2+}$ phosphors may be made by similar methods. For example, to manufacture the $A_2DSi_2O_7$:$Eu^{2+}$ phosphor, MgO, $MgCO_3$ and/or ZnO are also added to the above described starting materials. The first firing step may be carried out at 900 to 1250° C. in charcoal and the second firing step may be carried out at 900 to 1200° C. in a reducing atmosphere for 2–6 hours. To manufacture the $AAl_2O_4$:$Eu^{2+}$ phosphor, alkaline earth metal carbonate powders, such as $BaCO_3$, $SrCO_3$ and/or $CaCO_3$, europium oxide $Eu_2O_3$ and alumina, $Al_2O_3$, or aluminum hydroxide, $Al(OH)_3$ may be used as the starting materials. The first firing step may be carried out at 1300 to 1500° C. in charcoal and the second firing step may be carried out at 900 to 1200° C. in a reducing atmosphere for 2–6 hours. However, the first firing step may be omitted if a required temperature may be obtained during annealing in a reducing atmosphere.

The phosphor powder is then placed into the illumination system. For example, the phosphor powder may be placed over the LED chip, interspersed into the encapsulant material or coated onto the surface of the shell, as described above with respect to the first preferred embodiment of the present invention.

If the phosphor powder is coated onto the LED chip or the shell, then preferably, a suspension of the phosphor powder and a liquid is used to coat the LED chip or the shell surface. The suspension may also optionally contain a binder in a solvent. Preferably, the binder comprises an organic material, such as nitrocellulose or ethylcellulose, in a solvent such as butyl acetate or xylol. The binder enhances the adhesion of the powder particles to each other and to the LED or the shell. However, the binder may be omitted to simplify processing, if desired. After coating, the suspension is dried and may be heated to evaporate the binder. The phosphor 3 powder acts as the phosphor layer 21 after drying the solvent.

If the phosphor 3 powder is to be interspersed within the encapsulant material 19, then the phosphor powder may be added to a polymer precursor, and then the polymer precursor may be cured to solidify the polymer material. Alternatively, the phosphor 3 powder may be mixed in with the epoxy encapsulant. Other phosphor interspersion methods may also be used.

If the phosphor 3 is placed into a fluorescent lamp, then a suspension of the phosphor powder and a liquid is used to coat the lamp interior surface. The suspension may also optionally contain a binder in a solvent, as described above.

While the phosphor coating method has been described as a coating of a phosphor, the luminescent material(s) may comprise single crystal scintillator material(s) instead of or in addition to the phosphor, if desired. The scintillator may be made by any scintillator fabrication method. For example, the scintillator may be formed by Czochralski, float zone, or other crystal growing methods. The scintillator may then be placed over the LED chip or used as the shell or as a top portion of the shell of the illumination system.

The following examples are merely illustrative, and should not be construed to be any sort of limitation on the scope of the claimed invention.

Example 1

A phosphor with the general composition $(Ba_{1-x}Eu_x)_2SiO_4$, where $0<x\leq0.20$, was synthesized as follows. The following amounts of raw materials were weighed and placed in a polyethylene bottle: 39.08 g $BaCO_3$, 6.98 g silicic acid, 1.76 g $Eu_2O_3$ and 0.36 g $BaF_2$. A 10 weight percent excess of $BaCO_3$ was factored into the batch calculations. The amount of barium fluoride flux corresponded to 2 weight percent per mole of the phosphor produced. The raw materials were mixed and blended by dry ball-milling for 2 hours.

The blended starting powder mixture was placed in a covered alumina crucible, which was placed in a second crucible filled roughly ⅓ full with activated charcoal flakes. The second crucible was covered, and the starting powder mixture was fired at 1300° C. for 6 hours. The resultant cake was ground with a mortar and pestle, and blended via dry ball-milling for 30 minutes to form a powder.

The powder was annealed in an open crucible at 1100° C. for 2 hours in a 1% hydrogen/nitrogen atmosphere. The annealed powder was wet milled for 10 minutes in ethanol. The ethanol was extracted via filtration, and the powder was dried overnight at 70° C. The resultant phosphor powder luminesced a bright blue-green under short and long-wave UV irradiation.

Figure 9:
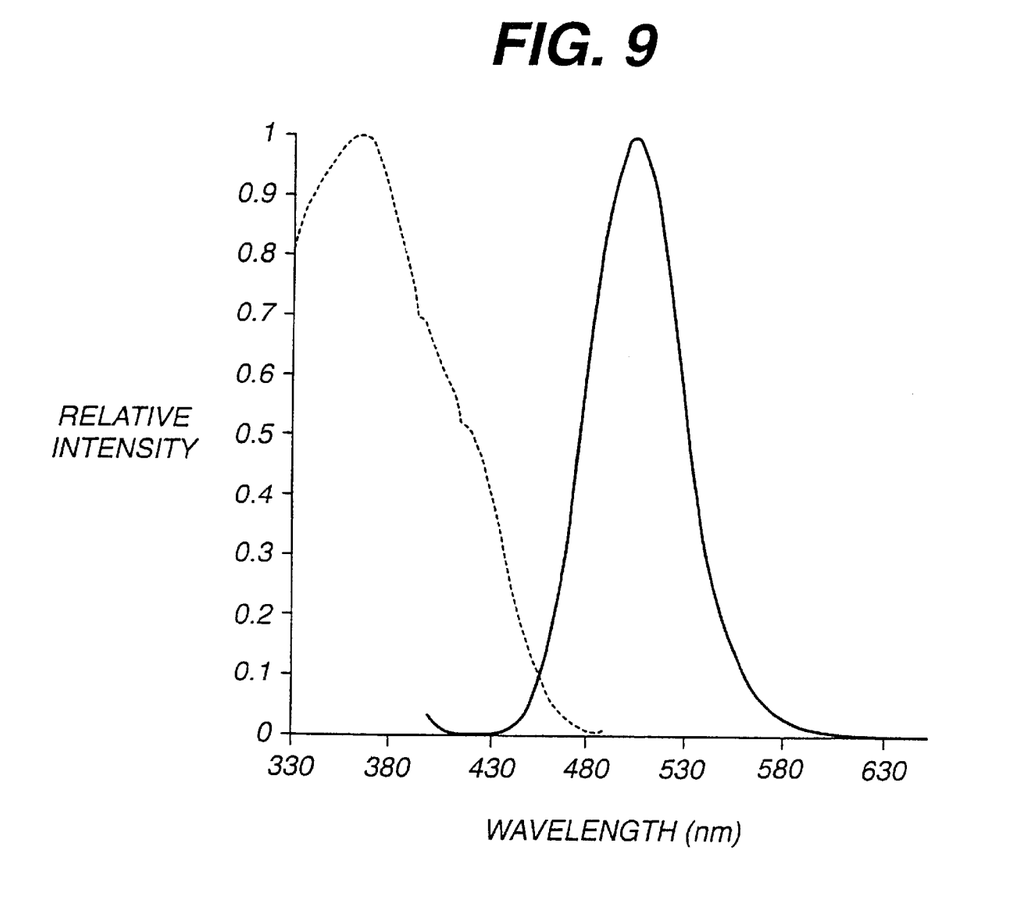
FIG. 9 is a plot of the excitation and emission spectra of the $BaSiO_4:Eu^{2+}$ phosphor.

The emission and excitation spectra of the $(Ba_{1-x}Eu_x)_2SiO_4$ phosphor are illustrated in FIG. 9. The excitation curve (dashed line) demonstrates that the peak excitation wavelength is about 362 nm and that the phosphor can be efficiently excited to blue-green luminescence by 370 nm, 390 nm and 405 nm photons. The emission curve (solid line) illustrates that the peak emission wavelength is about 505 nm. The CIE chromaticity coordinates derived from the emission curve were about x=0.12 and y=0.49. Thus, the chromaticity coordinates of the phosphor were about the same as those of the InGaN LED of the prior art. The other optical properties of the $(Ba_{1-x}Eu_x)_2SiO_4$ phosphor were comparable to the prior art LED optical properties, as illustrated in Table III, below.

TABLE III

| Phosphor Color Coordinates | | Peak Emission Wavelength | Emission Peak Half Width | External Quantum Efficiency | Efficacy (lm/W) |
|---|---|---|---|---|---|
| x | y | | | | |
| 0.12 | 0.49 | 505 nm | 60 nm | 75–85% | 340 lm/W |

Efficacy is defined as the product of the system luminosity times 683 lm/W, where 683 lm/W is the peak luminosity at 555 nm. System luminosity is defined as $(\int F(\lambda) Y(\lambda) d\lambda)/(\int F(\lambda) d\lambda)$, where $F(\lambda)$ is the emission spectrum and $Y(\lambda)$ is the eye sensitivity curve. This phosphor is particularly attractive for traffic light and automotive applications since it is well excited by short and long wave UV radiation and displays little or no selective absorption of visible light.

The preferred embodiments have been set forth herein for the purpose of illustration. However, this description should not be deemed to be a limitation on the scope of the invention. Accordingly, various modifications, adaptations, and alternatives may occur to one skilled in the art without departing from the spirit and scope of the claimed inventive concept.

What is claimed is:

1. A blue-green illumination system, comprising:

a light emitting diode; and a luminescent material having emission CIE color coordinates located within an area of a pentagon on a CIE chromaticity diagram, whose corners have the following CIE color coordinates:

e) x=0.0137 and y=0.4831;
    b) x=0.2240 and y=0.3890;
    c) x=0.2800 and y=0.4500;
    g) x=0.2879 and y=0.5196; and
    h) x=0.0108 and y=0.7220.

2. The system of claim 1, wherein the light emitted by the system lacks any significant visible component emitted by the light emitting diode.

3. The system of claim 1, wherein the light emitting diode peak emission wavelength is between 360 and 420 nm.

4. The system of claim 1, wherein the luminescent material emission CIE color coordinates are x=0.1±0.05 and y=0.52±0.05.

5. The system of claim 4, wherein:

the light emitting diode peak emission wavelength is between 370 and 405 nm; and the luminescent material emission CIE color coordinates are x=0.12 and y=0.49.

6. The system of claim 1, wherein the emission CIE color coordinates of the luminescent material are located within an area of a quadrilateral on a CIE chromaticity diagram, whose corners have the following CIE color coordinates:

a) x=0.000 and y=0.506;
    b) x=0.224 and y=0.389;
    c) x=0.280 and y=0.450; and
    d) x=0.000 and y=0.730.

7. The system of claim 1, wherein the emission CIE color coordinates of the luminescent material are located within an area of a quadrilateral on a CIE chromaticity diagram, whose corners have the following CIE color coordinates:

e) x=0.0137 and y=0.4831;
    f) x=0.2094 and y=0.3953;
    g) x=0.2879 and y=0.5196; and
    h) x=0.0108 and y=0.7220.

8. The system of claim 1, wherein:

the luminescent material comprises an $A_2SiO_4:Eu^{2+}$ phosphor; and

A comprises at least one of Ba, Ca, Sr or Mg.

9. The system of claim 8, wherein:

A comprises at least 80% Ba.

10. The system of claim 9, wherein:

the $A_2SiO_4:Eu^{2+}$ phosphor comprises an $(A_{1-x}Eu_x)_2SiO_4$ phosphor; and $0<x\leq0.2$.

11. The system of claim 10, wherein A comprises barium.

12. The system of claim 1, wherein:

the luminescent material comprises an $A_2DSi_2O_7:Eu^{2+}$;

A comprises at least one of Ba, Ca or Sr; and

D comprises at least one of Mg or Zn.

13. The system of claim 12, wherein:

the $ADSiO:Eu^{2+}$ phosphor comprises a $Ba_2MgSi_2O_7:Eu^{2+}$ phosphor.

14. The system of claim 12, wherein:

the $A_2DSi_2O_7:Eu^{2+}$ phosphor comprises an $(A_{1-x}Eux)_2DSi_2O_7$ phosphor; and $0<x\leq0.2$.

15. The system of claim 14, wherein:
A comprises Ba; and
D comprises Mg.

16. The system of claim 1, wherein:
the luminescent material comprises an $AAl_2O_4:Eu^{2+}$ phosphor; and
A comprises at least one of Ba, Sr or Ca.

17. The system of claim 16, wherein:
A comprises at least 80% Ba.

18. The system of claim 17, wherein:
the $AAl_2O_4:Eu^{2+}$ phosphor comprises an $(A_{1-x}Eu_x)Al_2O_4$ phosphor; and $0<x\leq0.2$.

19. The system of claim 16, wherein A comprises at least one of Ba or Sr.

20. The system of claim 1, wherein:
the light emitting diode peak emission wavelength is between 370 and 405 nm; and
the luminescent material comprises one or more of the following phosphors:
  i) $(A_{1-x}Eu_x)_2SiO_4$, where A comprises at least one of Ba, Sr, Ca or Mg; and $0<x\leq0.2$;
  ii) $(A_{1-x}Eu_x)_2 DSi_2O_7$, where A comprises at least one of Ba, Sr or Ca; D comprises at least one of Mg or Zn; and $0<x\leq0.2$; or
  iii) $(A_{1-x}Eu_x)Al_2O_4$, where A comprises at least one of Ba, Sr or Ca; and $0<x\leq0.2$.

21. The system of claim 20, wherein the luminescent material comprises two or three phosphors selected from i), ii) and iii).

22. The system of claim 20, further comprising:
a shell containing the light emitting diode;
an encapsulating material between the shell and the light emitting diode; and wherein:
  a) the phosphor is coated over a surface of the light emitting diode;
  b) the phosphor is interspersed in the encapsulating material; or
  c) the phosphor is coated onto the shell.

23. The system of claim 22, further comprising:
a traffic signal housing containing the blue-green illumination system; and
a traffic light lens in front of the blue-green illumination system.

24. The system of claim 22, further comprising an automotive display containing the blue-green illumination system.

25. A traffic signal, comprising:
a housing;
at least one lens;
a radiation source having a peak emission wavelength of 420 nm and below; and
a luminescent material having emission CIE color coordinates located within an area of a quadrilateral on a CIE chromaticity diagram, whose corners have the following CIE color coordinates:
  a) x=0.000 and y=0.506;
  b) x=0.224 and y=0.389;
  c) x=0.280 and y=0.45; and
  d) x=0.000 and y=0.730.

26. The traffic signal of claim 25, wherein the radiation source comprises a light emitting diode or a fluorescent lamp.

27. The traffic signal of claim 26, wherein the luminescent material comprises one or more of the following phosphors having emission CIE color coordinates of x=0.1±0.05 and y=0.52±0.05:
  i) $(A_{1-x}Eu_x)_2SiO_4$, where A comprises at least one of Ba, Sr, Ca or Mg; and $0<x\leq0.2$;
  ii) $(A_{1-x}Eu_x)_2 DSi_2O_7$, where A comprises at least one of Ba, Sr or Ca; D comprises at least one of Mg or Zn; and $0<x\leq0.2$; or
  iii) $(A_{1-x}Eu_x)Al_2O_4$, where A comprises at least one of Ba, Sr or Ca; and $0<x\leq0.2$.

28. A method of making a blue-green light illumination system, comprising:
mixing a plurality of starting powders to form a starting powder mixture;
firing the starting powder mixture to form a calcined-body;
converting the calcined body into a phosphor powder having emission CIE color coordinates located within an area of a pentagon on a CIE chromaticity diagram, whose corners have the following CIE color coordinates:
  e) x=0.0137 and y=0.4831;
  b) x=0.2240 and y=0.3890;
  c) x=0.2800 and y=0.4500;
  g) x=0.2879 and y=0.5196; and
  h) x=0.0108 and y=0.7220;
placing the phosphor powder into the illumination system; and placing a light emitting diode into the illumination system.

29. The method of claim 28, wherein:
the light emitting diode peak emission wavelength is between 370 and 405 nm;
the phosphor powder emission CIE color coordinates are x=0.1±0.05 and y=0.52±0.05; and
the phosphor powder comprises at least one of:
  i) $(A_{1-x}Eu_x)_2SiO_4$, where A comprises at least one of Ba, Sr, Ca or Mg; and $0<x\leq0.2$;
  ii) $(A_{1-x}Eu_x)_2 DSi_2O_7$, where A comprises at least one of Ba, Sr or Ca; D comprises at least one of Mg or Zn; and $0<x\leq0.2$; or
  iii) $(A_{1-x}Eu_x)Al_2O_4$, where A comprises at least one of Ba, Sr or Ca; and $0<x\leq0.2$.

30. The method of claim 29, wherein the step of placing the phosphor powder into the illumination system comprises placing any two or three phosphor powders selected from i), ii) and iii) into the illumination system.

31. The method of claim 29, wherein:
the step of mixing comprises mixing a $SiO_2*H_2O$ powder, a $Eu_2O_3$ powder, a $BaCO_3$ powder and a flux selected from at least one of $BaF_2$ or $EuF_3$ to form the starting powder mixture; and
the step of firing comprises firing the starting powder mixture in a charcoal atmosphere for 5–7 hours at 1200 to 1400° C. and then in a reducing atmosphere at about 900 to 1200° C. for 2–6 hours.

32. The method of claim 29, wherein:
the step of mixing comprises mixing a $SiO_2*H_2O$ powder, a $Eu_2O_3$ powder a $BaCO_3$ powder and one of a $MgCO_3$ or a MgO powders to form the starting powder mixture; and
the step of firing comprises firing the starting powder mixture in a charcoal atmosphere for 5–7 hours at 900 to 1250° C. and then in a reducing atmosphere at about 900 to 1200° C. for 2–6 hours.

33. The method of claim 29, wherein:
the step of mixing comprises mixing at least one of an $Al(OH)_3$ powder and an $Al_2O_3$ powder, a $Eu_2O_3$ powder, and at least one of a $SrCO_3$ powder and a $BaCO_3$ powder to form the starting powder mixture; and the step of firing comprises firing the starting powder mixture in a charcoal atmosphere for 5–7 hours at 1300 to 1500° C. and then in a reducing atmosphere at about 900 to 1200° C. for 2–6 hours.

34. The method of claim 29, further comprising:

placing the light emitting diode into a shell; and filling the shell with an encapsulating material.

35. The method of claim 34, further comprising:

a) coating a suspension of the phosphor powder and a solvent over a surface of the light emitting diode and drying the suspension;

b) interspersing the phosphor powder in the encapsulating material; or c) coating a suspension of phosphor powder and a solvent onto the shell and drying the suspension.

36. The method of claim 28, wherein the emission CIE color coordinates of the phosphor are located within an area of a quadrilateral on a CIE chromaticity diagram, whose corners have the following CIE color coordinates:

a) x=0.000 and y=0.506;

b) x=0.224 and y=0.389;

c) x=0.280 and y=0.450; and d) x=0.000 and y=0.730.

37. The method of claim 36, further comprising placing the illumination system into a traffic signal housing.

38. The method of claim 28, wherein the emission CIE color coordinates of the phosphor are located within an area of a quadrilateral on a CIE chromaticity diagram, whose corners have the following CIE color coordinates:

e) x=0.0137 and y=0.4831;

f) x=0.2094 and y=0.3953;

g) x=0.2879 and y=0.5196; and h) x=0.0108 and y=0.7220.

39. The method of claim 36, further comprising placing the illumination system into an automotive display.

* * * * *